(12) United States Patent
Ashiba et al.

(10) Patent No.: US 11,798,863 B2
(45) Date of Patent: Oct. 24, 2023

(54) LAMINATE AND ELECTRONIC DEVICE

(71) Applicant: SEKISUI CHEMICAL CO., LTD., Osaka (JP)

(72) Inventors: Kouji Ashiba, Osaka (JP); Keigo Oowashi, Osaka (JP); Aki Koukami, Osaka (JP); Rui Zhang, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 380 days.

(21) Appl. No.: 16/770,186

(22) PCT Filed: Dec. 7, 2018

(86) PCT No.: PCT/JP2018/045121
§ 371 (c)(1),
(2) Date: Jun. 5, 2020

(87) PCT Pub. No.: WO2019/112048
PCT Pub. Date: Jun. 13, 2019

(65) Prior Publication Data
US 2020/0388551 A1     Dec. 10, 2020

(30) Foreign Application Priority Data
Dec. 8, 2017   (JP) .................................. 2017-236233

(51) Int. Cl.
*B32B 15/08*     (2006.01)
*B32B 27/20*     (2006.01)
(Continued)

(52) U.S. Cl.
CPC ............ *H01L 23/3735* (2013.01); *B32B 3/10* (2013.01); *B32B 15/08* (2013.01); *B32B 15/092* (2013.01);
(Continued)

(58) Field of Classification Search
CPC ............ H01L 23/3735; H01L 21/4882; H01L 23/3114; H01L 24/32; H01L 24/48;
(Continued)

(56) References Cited

U.S. PATENT DOCUMENTS 6,175,084 B1    1/2001  Saitoh et al.
6,369,332 B1 *  4/2002  Saitoh .................. H05K 3/0061
                                                 174/255

(Continued)

FOREIGN PATENT DOCUMENTS

CN     1819163      8/2006
CN     104160491    11/2014
(Continued)

OTHER PUBLICATIONS

International Search Report dated Feb. 5, 2019 in International (PCT) Application No. PCT/JP2018/045121.
(Continued)

*Primary Examiner* — John D Freeman
(74) *Attorney, Agent, or Firm* — Wenderoth, Lind & Ponack, L.L.P.

(57) ABSTRACT

The problem to be solved by the invention is to provide a laminate capable of effectively enhancing thermal conductivity and adhesiveness, in spite of the relatively large thickness of a patterned metal layer. The laminate (1) according to the present invention includes a metal substrate (4), an insulating layer (2) laminated on one surface of the metal substrate (4), and a patterned metal layer (3) laminated on the surface of the insulating layer (2) on the side opposite to the metal substrate (4), the metal layer (3) is 300 μm or more in thickness, and the insulating layer (2) includes boron nitride (12) and an inorganic filler (13) other than boron nitride.

7 Claims, 3 Drawing Sheets

(51) Int. Cl.
  *B32B 15/092* (2006.01)
  *H01L 23/373* (2006.01)
  *B32B 3/10* (2006.01)
  *H01L 21/48* (2006.01)
  *H01L 23/00* (2006.01)

(52) U.S. Cl.
  CPC .......... *B32B 27/20* (2013.01); *H01L 21/4882* (2013.01); *H01L 24/73* (2013.01); *B32B 2264/10* (2013.01); *B32B 2264/102* (2013.01); *B32B 2264/107* (2013.01); *B32B 2307/206* (2013.01); *B32B 2307/304* (2013.01); *B32B 2457/00* (2013.01); *H01L 2224/32225* (2013.01); *H01L 2224/73265* (2013.01); *H01L 2924/0503* (2013.01); *H01L 2924/05032* (2013.01); *H01L 2924/0532* (2013.01); *H01L 2924/05432* (2013.01); *H01L 2924/15787* (2013.01); *H01L 2924/15798* (2013.01)

(58) Field of Classification Search
  CPC .......... H01L 24/73; H01L 2224/32225; H01L 2224/48175; H01L 2224/73265; H01L 2924/04642; H01L 2924/0503; H01L 2924/05032; H01L 2924/0532; H01L 2924/05432; H01L 2924/15787; H01L 2924/15798; H01L 23/373; B32B 3/10; B32B 15/08; B32B 27/20; B32B 2264/102; B32B 2264/107; B32B 2457/00; B32B 2250/03; B32B 2264/10; B32B 2264/1023; B32B 2264/12; B32B 2264/20; B32B 2307/202; B32B 2307/206; B32B 2307/302; B32B 2307/304; B32B 2457/14; B32B 15/00; B32B 27/38; B32B 15/092; B32B 27/26; B32B 27/283; C08K 3/013; C08K 3/22; C08K 3/28; C08K 3/34; C08K 3/38; C08K 2003/222; C08K 2003/2227; C08K 2003/282; C08K 2003/385; C08K 2201/016

See application file for complete search history.

(56) References Cited

U.S. PATENT DOCUMENTS

| | | | |
|---|---|---|---|
| 2003/0040563 A1* | 2/2003 | Sagal | C08K 3/22 |
| | | | 524/404 |
| 2006/0165978 A1 | 7/2006 | Ito et al. | |
| 2010/0277872 A1 | 11/2010 | Ito et al. | |
| 2015/0118509 A1 | 4/2015 | Mizuno et al. | |
| 2018/0163015 A1 | 6/2018 | Takezawa et al. | |
| 2019/0037692 A1 | 1/2019 | Mizuno et al. | |
| 2019/0077133 A1 | 3/2019 | Sawaguchi et al. | |
| 2019/0092695 A1 | 3/2019 | Nishi et al. | |
| 2020/0140651 A1 | 5/2020 | Takezawa et al. | |

FOREIGN PATENT DOCUMENTS

| | | |
|---|---|---|
| CN | 104412721 | 3/2015 |
| EP | 2 871 918 | 5/2015 |
| EP | 3 428 223 | 1/2019 |
| JP | 8-148781 | 6/1996 |
| JP | 8-288604 | 11/1996 |
| JP | 8-288659 | 11/1996 |
| JP | 9-139580 | 5/1997 |
| JP | 2006-210597 | 8/2006 |
| JP | 2013-89670 | 5/2013 |
| JP | 2014-40533 | 3/2014 |
| JP | 2017-168825 | 9/2017 |
| WO | 2013/061975 | 5/2013 |
| WO | 2014/007327 | 1/2014 |
| WO | 2016/093248 | 6/2016 |
| WO | 2016/190260 | 12/2016 |
| WO | 2017/155110 | 9/2017 |

OTHER PUBLICATIONS

International Preliminary Report on Patentability dated Jun. 9, 2020 in International (PCT) Patent Application No. PCT/JP2018/045121.
Extended European Search Report dated Jun. 17, 2021 in corresponding European Patent Application No. 18885222.2.

* cited by examiner

LAMINATE AND ELECTRONIC DEVICE

TECHNICAL FIELD

The present invention relates to a laminate including a metal substrate, an insulating layer, and a metal layer.

BACKGROUND ART

In recent years, the reduction in size and the increase in performance for electronic devices have been progressing, and the package density of electronic components has been increased. For this reason, how to dissipate the heat generated from the electronic components in a narrow space has been problematic. Since the heat generated from the electronic components is directly linked to the reliability of the electronic devices, efficient dissipation of the generated heat is an urgent issue.

As a means for solving the above-mentioned problem, there is a cited means of using a ceramic substrate with high thermal conductivity for a heat dissipation substrate on which power semiconductor devices and the like are mounted. Examples of such a ceramic substrate include an alumina substrate and an aluminum nitride substrate.

The means of using the ceramic substrate, however, has the problem of difficulty in multi-layering, poor workability, and thus very high cost. Moreover, since the difference in linear expansion coefficient is large between the ceramic substrate and the copper circuit, the means also has a problem that the copper circuit is easily peeled off during cooling-heating cycles.

Thus, resin compositions obtained with the use of boron nitride which is low in linear expansion coefficient, in particular, hexagonal boron nitride, have been attracting attention as heat dissipation materials. The crystal structure of hexagonal boron nitride is a layered structure of hexagonal network similar to graphite, and the hexagonal boron nitride has a scaly particle shape. For this reason, it is known that hexagonal boron nitride is higher in thermal conductivity in the plane direction than in the thickness direction, and thus has the property that the thermal conductivity is anisotropic. The above-mentioned resin composition may be used as insulating layers such as resin sheets or prepregs.

As an example of a resin composition containing boron nitride, Patent Document 1 below discloses a thermosetting resin composition in which a thermally conductive filler is dispersed in a thermosetting resin matrix. The filler is a secondary aggregate of primary particles aggregated. The resin matrix has a glass transition temperature of 170° C. or more after curing, and a viscosity 20 Pa·s or less at 100° C. before the start of the curing. The above-mentioned primary particles are boron nitride crystals.

Furthermore, Patent Document 2 below discloses a heat dissipation member including an insulating resin layer composed of a thermosetting adhesive. In the use of the heat dissipation member mentioned above, one side of the insulating resin layer is bonded to an adherend and cured, and the heat of the adherend is dissipated through the insulating resin layer. The thermosetting adhesive mentioned above contains boron nitride particles (A), an epoxy resin (B), a phenol resin (C), and tetraphenylphosphonium tetraphenylborate (D1). The content of the boron nitride particles (A) in the thermosetting adhesive is 40% by volume or more and 65% by volume or less. The thermosetting adhesive contains a trishydroxyphenylmethane-type epoxy resin (B1) as the epoxy resin (B). The thermosetting adhesive contains a phenol novolac resin (C1), a phenol aralkyl resin (C2), or a trishydroxyphenylmethane-type phenol resin (C3) as the phenol resin (C).

RELATED ART DOCUMENTS

Patent Documents

Patent Document 1: JP 2014-040533 A
Patent Document 2: JP 2013-89670 A

SUMMARY OF THE INVENTION

Problems to be Solved by the Invention

Conventional resin compositions containing boron nitride may be molded into resin sheets or the like, and used as insulating layers. The insulating layers may be laminated with a metal layer such as a copper foil or a metal plate, and used as laminates. For the laminates, circuit patterns may be formed through processing the metal layer by etching or the like.

In recent years, for the above-mentioned circuit patterns of power devices and the like, metal layers that form the circuit patterns has been increased in thickness in order to cope with increases in current and reductions in thermal load for the power devices and the like, for example, the copper thickening of increasing the thicknesses of copper patterns for circuits has been progressing.

When the circuit patterns are of thick copper, insulating layers obtained with conventional resin compositions containing boron nitride as described in Patent Documents 1 and 2 are capable of enhancing the thermal conductivity because of the use of boron nitride, but it is difficult to enhance the adhesiveness between the circuit patterns (thick copper) and the insulating layers. The conventional insulating layers containing boron nitride have difficult in achieving a balance between thermal conductivity and adhesiveness.

An object of the present invention is to provide a laminate capable of effectively enhancing thermal conductivity and adhesiveness in spite of the relatively large thickness of a patterned metal layer. Moreover, another object of the present invention is to provide an electronic device obtained with the use of the laminate.

Means for Solving the Problems

According to a broad aspect of the present invention, there is provided a laminate including a metal substrate, an insulating layer laminated on one surface of the metal substrate, and a patterned metal layer laminated on a surface of the insulating layer on the side opposite to a metal substrate side, the metal layer being 300 μm or more in thickness, and the insulating layer including boron nitride and an inorganic filler other than boron nitride.

In a specific aspect of the laminate according to the present invention, the boron nitride has an average aspect ratio of 2 or more, and the inorganic filler other than the boron nitride has an average aspect ratio of less than 2.

In a specific aspect of the laminate according to the present invention, a material for the inorganic filler other than the boron nitride is an aluminum oxide, an aluminum nitride, a magnesium oxide, or a silicon carbide.

In a specific aspect of the laminate according to the present invention, the content of the inorganic filler other than the boron nitride on a metal layer side of the insulating layer is higher than the content of the inorganic filler other than the boron nitride on the metal substrate side of the insulating layer.

In a specific aspect of the laminate according to the present invention, the insulating layer includes the boron nitride as boron nitride aggregated particles.

In a specific aspect of the laminate according to the present invention, the insulating layer includes a thermosetting compound and a thermosetting agent or a curing catalyst.

In a specific aspect of the laminate according to the present invention, the thermosetting compound includes an epoxy compound, an oxetane compound, an episulfide compound, or a silicone compound.

In a specific aspect of the laminate according to the present invention, the laminate is used with a semiconductor chip disposed on a surface of the metal layer on the side opposite to an insulating layer side.

According to a broad aspect of the present invention, there is provided an electronic device including the above-described laminate and a semiconductor chip disposed on a surface of the metal layer on the side opposite to an insulating layer side in the laminate.

Effect of the Invention

The laminate according to the present invention includes a metal substrate, an insulating layer laminated on one surface of the metal substrate, and a patterned metal layer laminated on a surface of the insulating layer on the side opposite to a metal substrate side. For the laminate according to the present invention, the metal layer is 300 µm or more in thickness. For the laminate according to the present invention, the insulating layer includes boron nitride, and an inorganic filler other than boron nitride. The laminate according to the present invention has the above-described configuration, thus making possible to effectively enhance the thermal conductivity and the adhesiveness, in spite of the relatively large thickness of the patterned metal layer.

MODE(S) FOR CARRYING OUT THE INVENTION

Hereinafter, the present invention will be described in detail.
(Laminate)

The laminate according to the present invention includes a metal substrate, an insulating layer, and a metal layer. The insulating layer is laminated on one surface of the metal substrate. The metal layer is laminated on the surface of the insulating layer on the side opposite to the metal substrate. The insulating layer may be laminated on the other surface of the metal substrate. The metal layer is patterned, which is a metal layer formed by patterning. The patterned metal layer is preferably a metal layer that serves as a circuit pattern, for example. The metal layer is disposed on a partial region of the surface of the insulating layer on the side opposite to the metal substrate. In the laminate, there is a region where the metal layer is not disposed at the surface of the insulating layer on the side opposite to the metal substrate.

For the laminate according to the present invention, the metal layer is 300 µm or more in thickness. The metal layer, which is 300 µm or more in thickness, is thus relatively large. For the laminate according to the present invention, the insulating layer includes boron nitride, and an inorganic filler other than boron nitride.

The laminate according to the present invention has the above-described configuration, thus making possible to effectively enhance the thermal conductivity and the adhesiveness, in spite of the relatively large thickness of the patterned metal layer.

The inventors have found out that a case where the metal layer of the laminate is less than 300 µm in thickness (that is, a case where the thickness of the metal layer is relatively small) and a case where the metal layer of the laminate is 300 µm or more in thickness (that is, a case where the thickness of the metal layer is relatively large) are different in separation mechanism in the separation between the insulating layer and the metal layer. The inventors have found out a problem that when the metal layer of the laminate is 300 µm or more in thickness, in the separation between the insulating layer and the metal layer, a crack is caused from an interlayer fragile site of the insulating layer as a starting point, thereby causing the insulating layer to be delaminated. This problem is caused when the metal layer of the laminate is 300 µm or more in thickness. The present inventors have found out that, as a result of intensive studies for suppressing interlayer crack generation of the insulating layer, the use of boron nitride and an inorganic filler other than boron nitride in combination makes it possible to disperse the stress applied to the insulating layer, and then suppress interlayer crack generation of the insulating layer. As a result, the adhesiveness between the insulating layer and the metal layer can be further effectively enhanced.

The laminate according to the present invention has the above-mentioned configuration, thus making it possible to achieve a balance between enhancement in the thermal conductivity and enhancement in the adhesiveness between the insulating layer and the metal layer.

According to the present invention, it is important for the insulating layer to employ a composition including boron nitride and an inorganic filler other than boron nitride in the laminate including the patterned metal layer of 300 µm or more in thickness.

For the laminate according to the present invention, the metal layer is 300 µm or more in thickness. From the viewpoint of further effectively enhancing the thermal conductivity, the metal layer is preferably 350 µm or more, more preferably 400 µm or more in thickness. From the viewpoint of avoiding an excessive increase in the size of the laminate, the metal layer is preferably 3000 µm or less, more preferably 2000 µm or less in thickness.

From the viewpoint of further effectively enhancing the thermal conductivity and the adhesiveness, the insulating layer is preferably 60 μm or more, more preferably 70 μm or more, and preferably 500 μm or less, more preferably 400 μm or less in thickness.

From the viewpoint of further effectively enhancing the thermal conductivity, the metal substrate is preferably 300 μm or more, more preferably 500 μm or more, and preferably 5000 μm or less, more preferably 4000 μm or less in thickness.

(Insulation Layer)

For the laminate according to the present invention, the insulating layer includes boron nitride, and an inorganic filler other than boron nitride.

Boron Nitride:

For the laminate according to the present invention, the insulating layer includes boron nitride. The boron nitride is not particularly limited. Examples of the boron nitride include hexagonal boron nitride, cubic boron nitride, boron nitride prepared by a reduction nitridation method with a boron compound and ammonia, boron nitride prepared from a boron compound and a nitrogen-containing compound such as melamine, and boron nitride prepared from sodium borohydride and ammonium chloride. From the viewpoint of further effectively enhancing the thermal conductivity, the boron nitride is preferably hexagonal boron nitride.

From the viewpoint of further effectively enhancing the thermal conductivity and the adhesiveness, the average aspect ratio of the boron nitride is preferably 2 or more, more preferably 4 or more, and preferably 20 or less, more preferably 15 or less.

The aspect ratio of the boron nitride indicates a major axis/minor axis. The average aspect ratio of the boron nitride is preferably determined by observing arbitrarily selected fifty respective boron nitrides with an electron microscope or an optical microscope, measuring the major axis/minor axis of each boron nitride, and calculating the average value.

From the viewpoint of further effectively enhancing the thermal conductivity and the adhesiveness, the average major axis of the boron nitride is preferably 1 μm or more, more preferably 2 μm or more, and preferably 40 μm or less, more preferably 30 μm or less.

The average major axis of the boron nitride is preferably determined by observing arbitrarily selected fifty respective boron nitrides with an electron microscope or an optical microscope, measuring the major axis of each boron nitride, and calculating the average value.

From the viewpoint of further effectively enhancing the thermal conductivity and the adhesiveness, the content of the boron nitride in 100% by volume of the insulating layer is preferably 20% by volume or more, more preferably 30% by volume or more, and preferably 80% by volume or less, more preferably 70% by volume or less.

From the viewpoint of further effectively enhancing the thermal conductivity and the adhesiveness, the insulating layer preferably includes boron nitride aggregated particles. The insulating layer preferably includes the boron nitride as boron nitride aggregated particles. The boron nitride included in the insulating layer is preferably boron nitride aggregated particles.

Boron Nitride Aggregated Particles:

From the viewpoint of further effectively enhancing the thermal conductivity and the adhesiveness, the average aspect ratio of the boron nitride aggregated particles is preferably 0.6 or more, more preferably 0.8 or more, and preferably 1.8 or less, more preferably 1.6 or less.

The aspect ratio of the boron nitride aggregated particles indicates a major axis/minor axis. The average aspect ratio of the boron nitride aggregated particles is preferably determined by observing arbitrarily selected fifty respective boron nitride aggregated particles with an electron microscope or an optical microscope, measuring the major axis/minor axis of each aggregated particle, and calculating the average value.

From the viewpoint of further effectively enhancing the thermal conductivity and the adhesiveness, the particle sizes of the boron nitride aggregated particles are preferably 10 μm or more, more preferably 15 μm or more, and preferably 200 μm or less, more preferably 150 μm.

The particle size of the boron nitride aggregated particles is preferably an average particle size obtained by averaging the particle sizes on a volume basis. The particle size of the boron nitride agglomerated particles can be measured with the use of a "laser diffraction particle size distribution analyzer" manufactured by Malvern Panalytical Ltd. The particle size of the boron nitride aggregated particles can be also determined by observing arbitrarily selected fifty of the boron nitride aggregated particles with an electron microscope or an optical microscope, measuring the particle size of each aggregated particle, and calculating the average value. In observation with an electron microscope or an optical microscope, the particle size of each boron nitride aggregated particle is determined as a particle size corresponding to an equivalent circle diameter. In the observation with an electron microscope or an optical microscope, the average particle size obtained from the equivalent circle diameters of arbitrary fifty boron nitride aggregated particles is substantially equal to the average particle size corresponding to an equivalent sphere diameter. In the measurement with the laser diffraction particle size distribution analyzer, the particle size of each boron nitride aggregated particles is determined as a particle size corresponding to an equivalent sphere diameter. The average particle size of the boron nitride aggregated particles is preferably calculated by measurement with the laser diffraction particle size distribution analyzer.

From the viewpoint of further effectively enhancing the thermal conductivity, the thermal conductivity of the boron nitride aggregated particles is preferably 5 W/m·K or more, more preferably 10 W/m·K or more. The upper limit of the thermal conductivity of the boron nitride aggregated particles is not particularly limited. The thermal conductivity of the boron nitride aggregated particles may be 1000 W/m·K or less.

From the viewpoint of further effectively enhancing the thermal conductivity and the adhesiveness, the content of the boron nitride aggregated particles in 100% by volume of the insulating layer is preferably 20% by volume or more, more preferably 30% by volume or more, and preferably 80% by volume or less, more preferably 70% by volume or less.

The above-mentioned boron nitride aggregated particles is not particularly limited, and examples of the method include spray drying methods and fluidized-bed granulation methods. The method for producing the boron nitride aggregated particles is preferably a spray drying (also referred to as spray drying) method. Spray drying methods can be classified into a two-fluid nozzle method, a disk method (also referred to as a rotary method), an ultrasonic nozzle method, and the like depending on the spray method, and any of these methods can be applied. From the viewpoint of further easily controlling the total pore volume, the ultrasonic nozzle method is preferred.

Moreover, for the method for producing boron nitride aggregated particles, a granulation step is not necessarily required. Boron nitride aggregated particles may be employed which are formed by spontaneous collection of boron nitride primary particles with the growth of boron nitride crystals. Moreover, in order to make the particle sizes of boron nitride aggregated particles uniform, boron nitride aggregated particles ground may be employed.

The boron nitride agglomerated particles are preferably produced with primary particles of boron nitride as a material. The boron nitride as a material for the boron nitride aggregate particles is not particularly limited, and examples thereof include the boron nitride mentioned above. From the viewpoint of further effectively enhancing the thermal conductivity of the boron nitride aggregated particles, the boron nitride as a material for the boron nitride aggregated particles is preferably hexagonal boron nitride.

Inorganic Filler Other than Boron Nitride:

For the laminate according to the present invention, the insulating layer includes an inorganic filler other than boron nitride. The inorganic filler other than boron nitride preferably has an insulation property. The inorganic filler other than boron nitride is preferably insulating particles.

From the viewpoint of further effectively enhancing the thermal conductivity and the adhesiveness, the average aspect ratio of the inorganic filler other than boron nitride is preferably less than 2, more preferably 1.5 or less. The lower limit of the average aspect ratio of the inorganic filler other than boron nitride is not particularly limited. The average aspect ratio of the inorganic filler other than boron nitride may be 1 or more.

The aspect ratio of the inorganic filler other than boron nitride indicates a major axis/minor axis. The average aspect ratio of the inorganic filler other than boron nitride is preferably determined by observing arbitrarily selected fifty respective inorganic fillers other than boron nitride with an electron microscope or an optical microscope, measuring the major axis/minor axis of each inorganic filler other than boron nitride, and calculating the average value.

From the viewpoint of further effectively enhancing the thermal conductivity and the adhesiveness, the particle size of the inorganic filler other than boron nitride is preferably 0.1 µm or more, more preferably 0.5 µm or more, and preferably 100 µm or less, more preferably 80 µm or less.

The particle size of the inorganic filler other than boron nitride means a diameter when the inorganic filler other than boron nitride has the shape of a true sphere, or a diameter in the case of assuming a true sphere equivalent to the volume of the inorganic filler other than boron nitride, when the inorganic filler other than boron nitride has a shape other than a true sphere.

The particle size of the inorganic filler other than boron nitride is preferably an average particle size obtained by averaging the particle sizes on a volume basis. The particle size of the inorganic filler other than boron nitride can be measured with the use of a "laser diffraction particle size distribution analyzer" manufactured by Malvern Panalytical Ltd. The particle size of the inorganic filler other than boron nitride can be also determined by observing the arbitrarily selected fifty inorganic fillers other than boron nitride with an electron microscope or an optical microscope, measuring the particle of each inorganic filler other than boron nitride, and calculating the average value. In observation with an electron microscope or an optical microscope, the particle size of each inorganic filler other than boron nitride is determined as a particle size corresponding to an equivalent circle diameter. In the observation with an electron microscope or an optical microscope, the average particle size obtained from the equivalent circle diameters of arbitrary fifty inorganic fillers other than boron nitride is substantially equal to the average particle size corresponding to an equivalent sphere diameter. In the measurement with the laser diffraction particle size distribution analyzer, the particle size of each inorganic filler other than boron nitride is determined as a particle size corresponding to an equivalent sphere diameter.

The material of the inorganic filler other than boron nitride is not particularly limited. The inorganic filler other than boron nitride is preferably an insulating filler. Examples of the material of the inorganic filler other than boron nitride include metal oxides such as aluminum oxide (alumina), calcium oxide, and magnesium oxide, metal nitrides such as aluminum nitride and titanium nitride, metal hydroxides such as aluminum hydroxide and magnesium hydroxide, metal carbonates such as calcium carbonate and magnesium carbonate, metal silicates such as calcium silicate, hydrated metal compounds, crystalline silica, amorphous silica, and silicon carbide. For the inorganic filler other than boron nitride, only one type of inorganic filler material other than boron nitride may be used, or two or more types may be used in combination.

From the viewpoint of further effectively enhancing the thermal conductivity and the adhesiveness, the material of the inorganic filler other than the boron nitride is preferably aluminum oxide, aluminum nitride, magnesium oxide, or silicon carbide. From the viewpoint of further effectively enhancing the thermal conductivity and the adhesiveness, the material of the inorganic filler other than boron nitride is more preferably aluminum oxide, aluminum nitride, or magnesium oxide, and even more preferably aluminum oxide or aluminum nitride.

From the viewpoint of further effectively enhancing the thermal conductivity, the thermal conductivity of the inorganic filler other than boron nitride is preferably 10 W/m·K or more, more preferably 20 W/m·K or more. The upper limit of the thermal conductivity of the inorganic filler other than boron nitride is not particularly limited. The thermal conductivity of the inorganic filler other than boron nitride may be 300 W/m·K or less, or 200 W/m·K or less. When the thermal conductivity of the inorganic filler other than boron nitride falls within the preferred range mentioned above, the thermal conductivity and the adhesiveness can be further effectively improved.

From the viewpoint of further effectively enhancing the thermal conductivity and the adhesiveness, the content of the inorganic filler other than boron nitride on the metal layer side of the insulating layer is preferably higher than the content of the inorganic filler other than boron nitride on the metal substrate side of the insulating layer. From the viewpoint of further effectively enhancing the thermal conductivity and the adhesiveness, the content of the inorganic filler other than boron nitride in a region corresponding to ½ the thickness of the insulating layer located on the metal layer side is preferably higher than the content of the inorganic filler other than boron nitride in the region corresponding to ½ the thickness of the insulating layer located on the metal layer side.

The content of the inorganic filler other than boron nitride in 100% by volume of the region (R1) corresponding to 30% of the thickness from the surface of the insulating layer on the metal layer side toward the surface of the insulating layer on the metal substrate side is regarded as a first content. The content of the inorganic filler other than boron nitride in 100% by volume of the region (R2) corresponding to 70% of the thickness from the surface of the insulating layer on the metal substrate side toward the surface of the insulating layer on the metal layer side is regarded as a second content.

Figure 3:
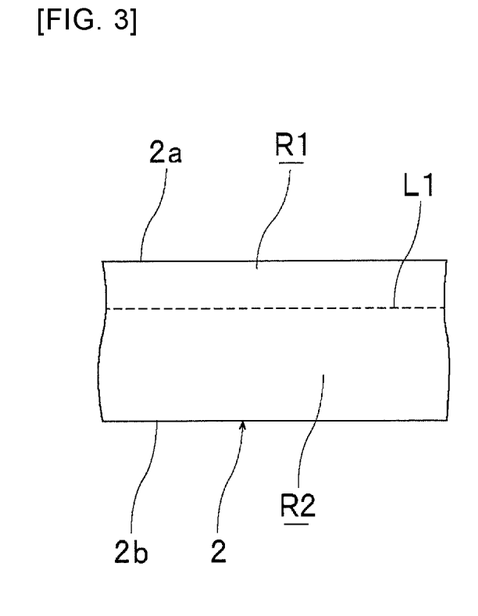
FIG. 3 is a schematic diagram for explaining each region for determining the content of an inorganic filler other than boron nitride in the laminate according to the present invention.

From the viewpoint of further effectively enhancing the thermal conductivity and the adhesiveness, the first content is preferably higher than the second content. The region (R1) preferably contains therein a high proportion of the inorganic filler other than boron nitride. The region (R1) refers to a region between a first surface 2a and a broken line L1 in FIG. 3. The region (R2) refers to a region between a second surface 2b and the broken line L1 in FIG. 3.

From the viewpoint of further effectively enhancing the thermal conductivity and the adhesiveness, the content of the inorganic filler other than boron nitride in 100% by volume of the insulating layer is preferably 3% by volume or more, more preferably 5% by volume or more, and preferably 60% by volume or less, more preferably 50% by volume or less, still more preferably 45% by volume or less.

From the viewpoint of further effectively enhancing the thermal conductivity and the adhesiveness, the first content of the inorganic filler other than boron nitride in 100% by volume of the region (R1) is preferably 5% by volume or more, more preferably 10% by volume or more, and preferably 60% by volume or less, more preferably 50% by volume or less.

From the viewpoint of further effectively enhancing the thermal conductivity and the adhesiveness, the second content of the inorganic filler other than boron nitride in 100% by volume of the region (R2) is preferably 1% by volume or more, more preferably 3% by volume or more, and preferably 50% by volume or less, more preferably 45% by volume or less.

From the viewpoint of further effectively enhancing the thermal conductivity and the adhesiveness, the absolute value of the difference between the first content and the second content is preferably 3% by volume or more, more preferably 5% by volume or more, and preferably 50% by volume or less, more preferably 40% by volume or less.

The first content of the inorganic filler other than boron nitride in 100% by volume of the region (R1) and the second content of the inorganic filler other than boron nitride in 100% by volume of the region (R2) can be calculated from an electron microscope image of a cross section of the laminate.

Thermosetting Compound:

The insulating layer preferably includes a thermosetting compound and a thermosetting agent or a curing catalyst. The thermosetting compound is not particularly limited. Examples of the thermosetting compounds include styrene compounds, phenoxy compounds, oxetane compounds, epoxy compounds, episulfide compounds, (meth)acrylic compounds, phenolic compounds, amino compounds, unsaturated polyester compounds, polyurethane compounds, silicone compounds, and polyimide compounds. For the thermosetting compound, only one type of thermosetting compound may be used, or two or more types may be used in combination.

From the viewpoint of further effectively enhancing the thermal conductivity and the adhesiveness, the thermosetting compound preferably includes an epoxy compound, an oxetane compound, an episulfide compound, or a silicone compound, and more preferably includes an epoxy compound. The epoxy compound is an organic compound having at least one epoxy group. For the epoxy compound, only one type of epoxy resin may be used, or two or more types may be used in combination.

Examples of the epoxy compound include bisphenol A type epoxy compounds, bisphenol F type epoxy compounds, bisphenol S type epoxy compounds, glycol-modified epoxy compounds, glycidylamine-type epoxy compounds, phenol novolac-type epoxy compounds, biphenyl-type epoxy compounds, biphenyl novolac-type epoxy. compounds, biphenol-type epoxy compounds, naphthalene-type epoxy compounds, fluorene-type epoxy compounds, phenol aralkyl-type epoxy compounds, naphthol aralkyl type epoxy compounds, dicyclopentadiene-type epoxy compounds, anthracene-type epoxy compounds, epoxy compounds having an adamantane skeleton, epoxy compounds having a tricyclodecane skeleton, naphthylene ether-type epoxy compounds, and epoxy compounds having a triazine nucleus in the skeleton.

From the viewpoint of further effectively enhancing the thermal conductivity and the adhesiveness, the epoxy compound is preferably a bisphenol A type epoxy compound.

From the viewpoint of further effectively enhancing the thermal conductivity and the adhesiveness, the content of the thermosetting compound in 100% by volume of the insulating layer is preferably 5% by volume or more, more preferably 10% by volume or more, and preferably 80% by volume or less, more preferably 70% by volume or less. From the viewpoint of further effectively enhancing the thermal conductivity and the adhesiveness, the content of a component derived from the thermosetting compound in 100% by volume of the insulating layer is preferably 5% by volume or more, more preferably 10% by volume or more, and preferably 80% by volume or less, more preferably 70% by volume or less.

Thermosetting Agent:

The insulating layer preferably includes a thermosetting compound and a thermosetting agent or a curing catalyst. The thermosetting agent is not specifically limited. As the thermosetting agent, a thermosetting agent capable of curing the thermosetting compound can be used appropriately. From the viewpoint of further effectively enhancing the adhesiveness, it is preferable to use the thermosetting agent and the effective catalyst in combination in the insulating layer. For the thermosetting agent, only one type of thermosetting agent may be used, or two or more types may be used in combination.

Examples of the thermosetting agent include cyanate ester compounds (cyanate ester curing agents), phenolic compounds (phenolic thermosetting agents), amine compounds (amine thermosetting agents), thiol compounds (thiol thermosetting agents), imidazole compounds, phosphine compounds, acid anhydrides, active ester compounds, and carbodiimide compounds. The thermosetting agent preferably has a functional group capable of reacting with the epoxy groups of the epoxy compounds.

Examples of the cyanate ester compounds include novolac-type cyanate ester resins, bisphenol type cyanate ester resins, and prepolymers with the resins partially trimerized. Examples of the novolac-type cyanate ester resins include phenol novolac-type cyanate ester resins and alkylphenol type cyanate ester resins. Examples of the bisphenol type cyanate ester resins include bisphenol A type cyanate ester resins, bisphenol E type cyanate ester resins, and tetramethylbisphenol F type cyanate ester resins.

Examples of the phenolic compounds include novolac-type phenol, biphenol-type phenol, naphthalene-type phenol, dicyclopentadiene-type phenol, aralkyl-type phenol, and dicyclopentadiene-type phenol.

Commercially available products of the above-mentioned phenolic compounds include novolac-type phenol ("TD-2091" manufactured by DIC), biphenyl novolac-type phenol ("MEHC-7851" manufactured by Meiwa Plastic Industries, Ltd.), an aralkyl-type phenolic compound ("MEH-7800" manufactured by Meiwa Plastic Industries, Ltd.), and phenols having an aminotriazine skeleton ("LA1356" and "LA3018-50P" manufactured by DIC).

Examples of the amine compounds include dicyandiamide.

In 100% by volume of the insulating layer, the total content of the thermosetting compound and the thermosetting agent is preferably 20% by volume or more, more preferably 25% by volume or more, and preferably 50% by volume or less, more preferably 45% by volume or less. In 100% by volume of the insulating layer, the total content of the thermosetting compound and a component derived from the thermosetting agent is preferably 20% by volume or more, more preferably 25% by volume or more, and preferably 50% by volume or less, more preferably 45% by volume or less. When the total content is not less than the above-mentioned lower limit, and not more than the above-mentioned upper limit, the thermal conductivity can be further effectively enhanced, and the adhesiveness can be further effectively enhanced. The content ratio between the thermosetting compound and the thermosetting agent is selected appropriately such that the thermosetting compound is cured.

The content of the thermosetting agent is selected appropriately such that the thermosetting compound is cured in a favorable manner. The content of the thermosetting agent with respect to 100 parts by weight of the thermosetting compound is preferably 1 part by weight or more, more preferably 3 parts by weight or more, and preferably 100 parts by weight or less, more preferably 80 parts by weight or less. When the content of the thermosetting agent is not less than the above-mentioned lower limit, sufficiently curing the thermosetting compound becomes much easier. When the content of the thermosetting agent is not more than the above-mentioned upper limit, an excessive thermosetting agent which does not participate in curing becomes less likely to be generated. For this reason, when the content of the thermosetting agent is not less than the above-mentioned lower limit, and not more than the above-mentioned upper limit, the heat resistance and adhesiveness of the cured product are further enhanced.

Curing Catalyst:

The insulating layer preferably includes a thermosetting compound and a thermosetting agent or a curing catalyst. The curing catalyst is not particularly limited. The curing catalyst acts as a curing catalyst in the reaction between the thermosetting compound and the thermosetting agent. Moreover, the curing catalyst acts as a polymerization catalyst when the thermosetting agent is not used. From the viewpoint of further effectively enhancing the adhesiveness, it is preferable to use the thermosetting agent and the curing catalyst in combination in the insulating layer. For the curing catalyst, only one type of curing catalyst may be used, or two or more types may be used in combination.

Examples of the curing catalyst include tertiary amines, tertiary amine salts, quaternary onium salts, tertiary phosphines, crown ether complexes, and phosphonium ylides. Specifically, examples of the curing catalyst include imidazole compounds, isocyanurates of imidazole compounds, dicyandiamide, dicyandiamide derivatives, melamine compounds, melamine compound derivatives, amine compounds such as diaminomaleonitrile, diethylenetriamine, triethylenetetramine, tetraethylenepentamine, bis(hexamethylene) triamine, triethanolamine, diaminodiphenylmethane, and organic acid dihydrazide, 1,8-diazabicyclo[5,4,0]undecene-7, 3,9-bis(3-aminopropyl)-2,4,8,10-tetraoxaspiro[5,5]undecane, and organic phosphine compounds such as triphenylphosphine, tricyclohexylphosphine, tributylphosphine, and methyldiphenylphosphine.

The content of the curing catalyst is selected appropriately such that the thermosetting compound is cured in a favorable manner. The content of the curing catalyst with respect to 100 parts by weight of the thermosetting compound is preferably 0.05 parts by weight or more, more preferably 0.1 parts by weight or more, and preferably 10 parts by weight or less, more preferably 5 parts by weight or less. When the content of the curing catalyst is not less than the above-mentioned lower limit and not more than the above-mentioned upper limit, the thermosetting compound can be cured in a favorable manner.

Other Components:

The insulating layer may contain, in addition to the components described above, other components which are commonly used for thermally conductive sheets and laminates, and the like, such as dispersants, chelating agents, and antioxidants.

(Metal Substrate)

The thermal conductivity of the metal substrate is preferably of 10 W/m·K or more. As the metal substrate, an appropriate material can be used. For the metal substrate, a metal material is preferably used. Examples of the metal material include a metal foil and a metal plate. The metal substrate is preferably the metal foil or the metal plate, and more preferably the metal plate.

Examples of the material for the metal material include aluminum, copper, gold, silver, and graphite sheets. From the viewpoint of further effectively enhancing the thermal conductivity, the material for the metal material is preferably aluminum, copper, or gold, more preferably aluminum or copper.

(Metal Layer)

The material for the metal layer is not particularly limited. Examples of the material for the metal layer include gold, silver, palladium, copper, platinum, zinc, iron, tin, lead, aluminum, cobalt, indium, nickel, chromium, titanium, antimony, bismuth, thallium, germanium, cadmium, silicon, tungsten, molybdenum, and alloys thereof. Furthermore, examples of the alloy include a tin-doped indium oxide (ITO) and a solder. From the viewpoint of further enhancing the thermal conductivity, the material for the metal layer is preferably aluminum, copper, or gold, more preferably aluminum or copper.

For the laminate according to the present invention, the metal layer is patterned, which is a metal layer formed by patterning. The method for forming a metal layer into a pattern is not particularly limited. Examples of the method for forming a metal layer into a pattern include a method of forming a metal layer and then removing a part of the metal layer into the pattern. Examples of the method for forming the metal layer include a method by electroless plating, a method by electroplating, and a method of applying thermocompression bonding to the insulating layer and the metal foil. Since the formation of the metal layer is simple, the method of applying thermocompression bonding to the insulating layer and the metal foil is preferred. Examples of the method for forming a metal layer into a pattern include etching.

Figure 1:
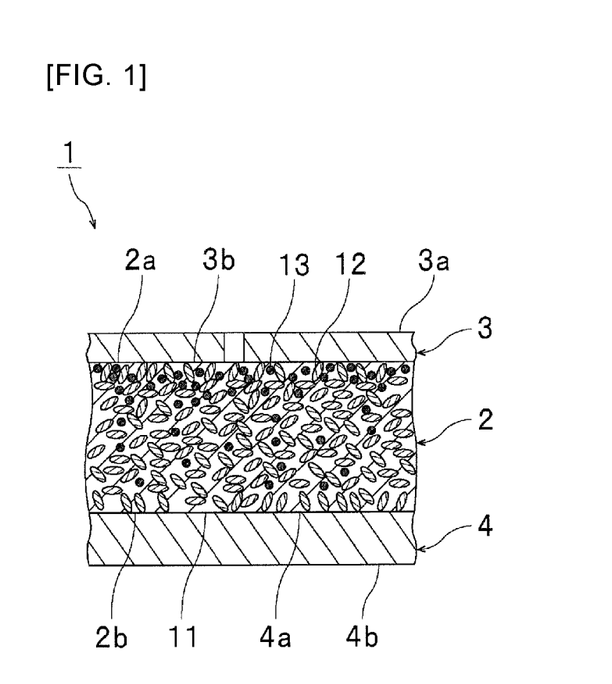
FIG. 1 is a cross-sectional view schematically illustrating a laminate according to an embodiment of the present invention.

FIG. 1 is a cross-sectional view schematically illustrating a laminate according to an embodiment of the present invention. It is to be noted that FIG. 1 is different from the actual size and thickness for the convenience of illustration.

The laminate 1 shown in FIG. 1 includes an insulating layer 2, a metal layer 3, and a metal substrate 4. The insulating layer 2, the metal layer 3, and the metal substrate 4 correspond to the above-described insulating layer, metal layer, and metal substrate.

The insulating layer 2 has one surface 2a (first surface) and the other surface 2b (second surface). The metal layer 3 has one surface 3a (first surface) and the other surface 3b (second surface). The metal substrate 4 has one surface 4a (first surface) and the other surface 4b (second surface).

The metal layer 3 is laminated on the side of the insulating layer 2 closer to the surface 2a (first surface). The metal substrate 4 is laminated on the side of the insulating layer 2 closer to the other surface 2b (second surface). The insulating layer 2 is laminated on the side of the metal layer 3 closer to the other surface 3b (second surface). The insulating layer 2 is laminated on the side of the metal substrate 4 closer to the surface 4a (first surface). The insulating layer 2 is disposed between the metal layer 3 and the metal substrate 4.

The method for manufacturing the laminate is not particularly limited. Examples of the method for manufacturing the laminate include a method in which the metal substrate, the insulating layer, and the metal layer are laminated, and subjected to thermocompression bonding by vacuum pressing, or the like.

Figure 4:
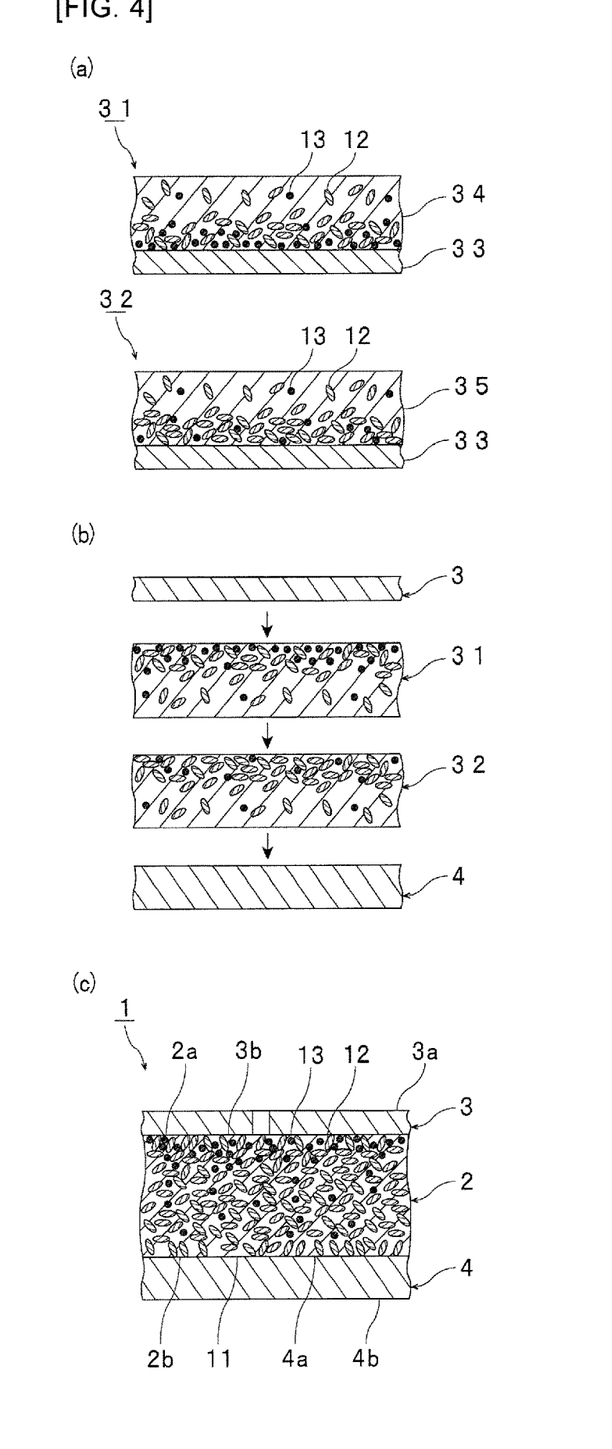
FIGS. 4(a) to 4(c) are schematic diagrams for explaining each step of an exemplary method for manufacturing the laminate according to the present invention.

FIGS. 4(a) to 4(c) are schematic diagrams for explaining each step of an exemplary method for manufacturing the laminate according to the present invention. It is to be noted that arrows in FIG. 4(b) refer to stacking directions.

As shown in FIG. 4(a), on a release film 33, a first insulating layer material 31 is prepared by applying a first curable material 34 in which a boron nitride 12 and an inorganic filler 13 other than boron nitride are dispersed in a thermosetting compound and a thermosetting agent. Furthermore, on a release film 33, a second insulating layer material 32 is prepared by applying a second curable material 35 in which a boron nitride 12 and an inorganic filler 13 other than boron nitride are dispersed in a thermosetting compound and a thermosetting agent. The first curable material 34 and the second curable material 35 may have the same composition or different compositions. The first curable material 34 and the second curable material 35 are, after being applied onto the release films 33, preferably semi-cured by heating or the like, and preferably semi-cured products. The first insulating layer material 31 and the second insulating layer material 32 are preferably in a semi-cured state by heating or the like, and are preferably semi-cured materials. The semi-cured products are not completely cured, and can further proceed with curing.

In the insulating layer material, the specific gravity of the boron nitride and the inorganic filler other than boron nitride is higher than the specific gravity of the thermosetting compound and the like, thus causing the boron nitride and the inorganic material other than boron nitride in the insulating layer material to have distributions produced. The concentrations of the boron nitride and the inorganic filler other than boron nitride on the release film side of the insulating layer material are higher than the concentrations of the boron nitride and the inorganic filler other than boron nitride on the air interface side of the insulating layer material (the side opposite to the release film side of the insulating layer material). When the specific gravity of the inorganic filler other than boron nitride is higher than the specific gravity of the boron nitride, the concentration of the inorganic filler other than boron nitride on the release film side of the insulating layer material is higher than the concentration of the inorganic filler other than boron nitride on the air interface side of the insulating layer material.

Next, as shown in FIG. 4(b), the metal substrate 4, the second insulating layer material, the first insulating layer material, and the metal layer 3 are stacked and pressed, thereby allowing for the laminate 1 according to the present invention as shown in FIG. 4(c).

Specifically, as shown in FIG. 4(b), the second insulating layer material 32 is stacked on the metal substrate 4 from the air interface side, and the release film is peeled off. Next, the first insulating layer material 31 is stacked on the second insulating layer material 32 from the air interface side to bond the first and second insulating layer materials to each other, and the release film is then peeled off. Next, the metal layer 3 is stacked on the first insulating layer material 31 and then pressed, thereby causing the interface of the insulating layer material to disappear to form an insulating layer. Then, the metal layer is subjected to patterning by etching to form an opening without any metal layer in a partial region on the insulating layer, thereby allowing for the laminate 1 according to the present invention. The insulating layer is a continuous layer.

For the laminate according to the present invention, the surface of the insulating layer material, which is higher in the concentrations of the boron nitride and the inorganic filler other than boron nitride, is bonded to the surface of the insulating layer material, which is lower in the concentrations of the boron nitride and the inorganic filler other than boron nitride. The surface of the insulating layer material, which is higher in the concentrations of the boron nitride and the inorganic filler other than boron nitride, is bonded to the surface of the insulating layer material, which is lower in the concentrations of the boron nitride and the inorganic filler other than boron nitride, thereby: pushing out air which is low in thermal conductivity, and then allowing the thermal conductivity to be enhanced; and reducing air gaps such as voids, and then allowing the insulating property to be enhanced.

When the surfaces of the insulating layer material, which are high in the concentrations of the boron nitride and inorganic filler other than boron nitride, are bonded to each other, the resin is more likely to be insufficient at the interface part, thereby making it difficult to enhance the insulating property due to the generation of voids and the like. Moreover, due to the lack of the resin at the interface part, interface delamination is more likely to be caused, thereby making it difficult to enhance the adhesiveness.

In the laminate 1 according to this embodiment, the insulating layer 2 includes a cured product part 11, boron nitride 12, and an inorganic filler 13 other than boron nitride. The boron nitride 12 and the inorganic filler 13 other than boron nitride refer to the above-described boron nitride and inorganic filler other than boron nitride.

In the laminate 1 according to the present embodiment, the cured product part 11 refers to a part where the thermosetting compound is cured. The cured product part 11 may be a part where the thermosetting compound and the thermosetting agent are cured, may be a part where the thermosetting compound, the thermosetting agent, and the curing catalyst are cured, or may be a part where the thermosetting compound and the curing catalyst are cured.

The laminate can be used for various use applications which require high thermal conductivity and mechanical strength, and the like. The laminate is preferably used with a semiconductor chip disposed on the surface of the metal layer on the side opposite to the insulating layer. For example, in an electronic device, the laminate is disposed and the used between a heat generation component and a heat dissipation component. For example, the laminate is used as a heat dissipator installed between a CPU and a fin, or a heat dissipator of a power card for use in an inverter of an electric vehicle or the like. Furthermore, since the patterned metal layer of the laminate can act as a circuit, the laminate can be used as an insulated circuit substrate.

(Electronic Device)

An electronic device according to the present invention includes the above-described laminate and a semiconductor chip. The semiconductor chip is disposed on the surface of the laminate on the side opposite to the insulating layer side of the metal layer. The semiconductor chip may be stacked on the surface of the metal layer with a connecting conductive part interposed therebetween. The laminate can be suitably used for obtaining an electronic device with a semiconductor chip stacked.

Figure 2:
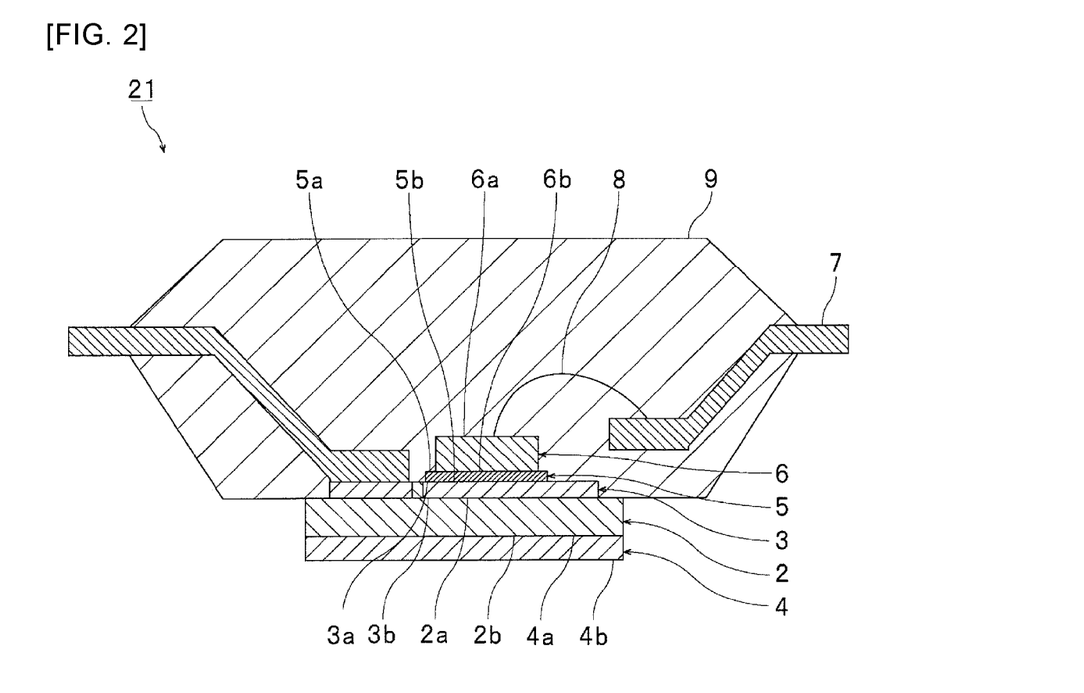
FIG. 2 is a cross-sectional view schematically illustrating an example of an electronic device obtained with the use of the laminate according to the embodiment of the present invention.

FIG. 2 is a cross-sectional view schematically illustrating an example of an electronic device obtained with the use of the laminate according to the embodiment of the present invention. It is to be noted that FIG. 2 is different from the actual size and thickness for the convenience of illustration.

The electronic device 21 shown in FIG. 2 includes an insulating layer 2, a metal layer 3, and a metal substrate 4. In the electronic device 21, the laminate 1 shown in FIG. 1 is used. In FIG. 2, the cured product part 11, the boron nitride 12, and the inorganic filler 13 other than boron nitride, included in the insulating layer 2, are omitted for the convenience of illustration.

The electronic device 21 shown in FIG. 2 includes a connecting conductive part 5, a semiconductor chip 6, a lead 7, a wire (metal wiring) 8, and a sealing resin 9 in addition to the above-mentioned configuration. The lead 7 has an electrode.

The connecting conductive part 5 has one surface 5a (first surface) and the other surface 5b (second surface). The semiconductor chip 6 has one surface 6a (first surface) and the other surface 6b (second surface).

The semiconductor chip 6 is laminated on the side of the connecting conductive part 5 closer to the surface 5a (first surface). The metal layer 3 is laminated on the side of the connecting conductive part 5 closer to the other surface 5b (second surface). The connecting conductive part 5 is laminated on the side of the semiconductor chip 6 closer to the other surface 6b (second surface). The connecting conductive part 5 is disposed between the semiconductor chip 6 and the metal layer 3. The semiconductor chip 6 is fixed to the side of the metal layer 3 closer to the surface 3a (first surface) by the connecting conductive part 5. The number of the fixed semiconductor chips may be one, or two or more. The connecting conductive part may be formed from a silver paste, or may be formed from a solder. The metal layer is formed into a pattern by etching or the like.

For the electronic device 21 according to the present embodiment, circuit patterns (not shown) are formed on the surface 6a (first surface) and other surface 6b (second surface) of the semiconductor chip 6. The circuit pattern formed on the surface 6a (first surface) of the semiconductor chip 6 is electrically connected to the electrode of the lead 7 via the wire 8.

Since the metal layer 3 is formed from a metal, the metal layer 3 may function as a heat sink. The metal layer 3 and the metal substrate 4 may be formed from the same material. The metal layer 3 and the metal substrate 4 may be formed from copper.

The sealing resin 9 seals therein the semiconductor chip 6, the connecting conductive part 5, the metal layer 3, the wire 8, and a part of the lead 7. The lead 7 has a part protruding from a side surface of the sealing resin 9 to the outside of the sealing resin 9. The sealing resin 9 is laminated on the side of the insulating layer 2 closer to surface 2a (first surface). The insulating layer 2 and the metal substrate 4 are not sealed with the sealing resin 9 and are exposed to the outside of the sealing resin 9.

From the viewpoint of further effectively enhancing the thermal conductivity, a dissipation fin may be disposed on the side of the metal substrate closer to the other surface (second surface).

Specific examples of the electronic device include a semiconductor package. The electronic device is not limited to the semiconductor package mentioned above.

Hereinafter, the present invention will be clarified by providing specific examples and comparative examples of the present invention. The present invention is not limited to the following examples.

Thermosetting Compound:
   (1) "Epicoat 828US" manufactured by Mitsubishi Chemical Corporation, epoxy compound Thermosetting Agent:
   (1) "Dicyandiamide" manufactured by Tokyo Chemical Industry Co., Ltd.
   (2) "2MZA-PW" manufactured by SHIKOKU CHEMICALS CORPORATION, isocyanuric modified solid dispersion-type imidazole Boron Nitride:
   (1) "UHP-G1H" manufactured by Showa Denko K.K., average aspect ratio: 11, average major axis: 3.2 µm, particle size: 35 µm Inorganic Filler Other than Boron Nitride:
   (1) "A20S" manufactured by Showa Denko K.K., average aspect ratio: 1, particle size: 20 µm, aluminum oxide
   (2) "AO-502" manufactured by Admatechs Company Limited, average aspect ratio: 1, particle size: 0.7 µm, aluminum oxide
   (3) "BMF-B" manufactured by KAWAI LIME INDUSTRY CO., LTD., average aspect ratio: 30, particle size: 5 µm, aluminum oxide
   (4) "RF-10C" manufactured by Ube Material Industries, Ltd., average aspect ratio: 1, particle size: 10 µm, magnesium oxide
   (5) "ALN200SF" manufactured by Thrutek Applied Materials Co., Ltd., average aspect ratio: 1, particle size: 20 µm, aluminum nitride (Average Aspect Ratios of Boron Nitride and Inorganic Filler Other than Boron Nitride)

The average aspect ratios of the boron nitride and inorganic filler other than boron nitride were measured as follows.

Method of measuring average aspect ratios of boron nitride and inorganic filler other than boron nitride:

The average aspect ratios were determined by observing arbitrarily selected fifty boron nitrides or inorganic fillers other than boron nitride with an electron microscope or an optical microscope, measuring the major axis/minor axis of each boron nitride or inorganic filler other than boron nitride, and calculating the average value.

(Average Major Axis of Boron Nitride)

The average major axis of the boron nitride was measured as follows.

Method of Measuring Average Major Axis of Boron Nitride:

The average major axis was determined by observing arbitrarily selected fifty respective boron nitrides with an electron microscope or an optical microscope, measuring the major axis of each boron nitride, and calculating the average value.

(Particle Size of Inorganic Filler Other than Boron Nitride)

The particle size of the inorganic filler other than boron nitride was measured as follows.

Method of Measuring Particle Size of Inorganic Filler Other than Boron Nitride:

The particle size was determined by observing arbitrarily selected fifty respective inorganic fillers other than boron nitride with an electron microscope or an optical microscope, measuring the particle of each inorganic filler other than boron nitride, and calculating the average value.

Example 1

(1) Preparation of First and Second Curable Materials

The thermosetting compound and the thermosetting agent were blended so as to provide 10 parts by weight of "Dicyandiamide" manufactured by Tokyo Chemical Industry Co., Ltd., and 1 part by weight of "2MZA-PW" manufactured by SHIKOKU CHEMICALS CORPORATION with respect to 100 parts by weight of "Epicoat 828US" manufactured by Mitsubishi Chemical Corporation. Next, the boron nitride and inorganic filler other than boron nitride shown in Table 1 below were blended to meet the contents (% by volume) shown in Table 1 below. Then, the mixture was appropriately diluted with methyl ethyl ketone, and stirred at 500 rpm for 25 minutes with the use of a planetary stirrer to obtain first and second curable materials.

(2) Preparation of Laminate

The first curable material obtained was applied onto a release PET sheet (50 μm in thickness) so as to have a thickness of 120 μm, and dried in an oven at 50° C. for 20 minutes to form a first insulating layer material. Next, the second curable material obtained was applied onto a release PET sheet (50 μm in thickness) so as to have a thickness of 280 μm, and dried in an oven at 50° C. for 20 minutes to form a second insulating layer material. In this regard, in the insulating layer material, the specific gravity of the boron nitride and the inorganic filler other than boron nitride was higher than the specific gravity of the thermosetting compound and the like, thus causing the boron nitride and the inorganic material other than boron nitride in the insulating layer material to have distributions produced. Moreover, since the specific gravity of the inorganic filler other than boron nitride is higher than the specific gravity of boron nitride, the concentration of the inorganic filler other than boron nitride on the release film side of the insulating layer material were higher than the concentration of the inorganic filler other than boron nitride on the air interface side of the insulating layer material.

Thereafter, the release PET sheet was peeled off by stacking on an aluminum plate (thickness: 1.0 mm) from the air interface side of the second insulating layer material. Next, the first and second insulating layer materials were bonded to each other by stacking on the second insulating layer material from the air interface side of the first insulating layer material, and the release PET sheet was then peeled off. Next, a copper plate (thickness: 500 μm) was stacked on the side from which the release PET sheet of the first insulating layer material had been peeled off, that is, on the side which was higher in the concentration of the inorganic filler other than boron nitride, and then subjected to vacuum pressing under the conditions of temperature: 200° C. and pressure: 10 MPa. The pressing eliminated the interface between the first and second insulating layer materials to form an insulating layer was formed. Then, the copper plate was subjected to patterning by etching to form an opening without any metal layer in a partial region on the insulating layer. In this way, a laminate was prepared. In the obtained laminate, the insulating layer was formed from a cured product of the first insulating layer material and a cured product of the second insulating layer material, and was a continuous layer. In the obtained laminate, the insulating layer was formed from a cured product of the first curable material and a cured product of the second curable material. The insulating layer of the obtained laminate was 245 μm in thickness.

Examples 2 to 11, Comparative Examples 1 to 3

In the same way as in Example 1 except that the types and contents (% by volume) of the boron nitride and inorganic filler other than boron nitride, and the thickness of the insulating layer of the laminate were changed as shown in Tables 1 to 3 below, first curable materials, second curable materials, and laminates were prepared.

(Evaluation)

(1) Content of Inorganic Filler Other than Boron Nitride

The cross section of the obtained laminate was processed smoothly with a cross section polisher ("IB-19500CP" manufactured by JEOL Ltd.), and the cross section of the processed laminate was observed with a field emission scanning electron microscope ("S-4800" manufactured by Hitachi High-Technologies Corporation). The inorganic filler other than boron nitride was identified with an energy dispersive X-ray spectrometer ("S-4800EN-EDS" manufactured by Hitachi High-Technologies Corporation). From the obtained electron microscope image, the first content of the inorganic filler other than boron nitride was calculated in 100% by volume of the region corresponding to 30% of the thickness from the first surface of the insulating sheet (insulating layer) toward the second surface of the insulating sheet. Furthermore, the second content of the inorganic filler other than boron nitride was calculated in 100% by volume of the region corresponding to 70% of the thickness from the second surface of the insulating sheet (insulating layer) toward the first surface of the insulating sheet.

(2) Thermal Conductivity

The obtained laminate was cut into a 1 cm square, and both sides thereof were then sprayed with carbon black to prepare a measurement sample. With the use of the obtained measurement sample, the thermal conductivity was calculated by a laser flash method. The thermal conductivity was determined in accordance with the following criteria by calculating a relative value with the value of Comparative Example 1 regarded as 1.0.

[Criteria for Thermal Conductivity]

∘∘: the thermal conductivity of 1.5 or more, with the thermal conductivity of Comparative Example 1 regarded as 1.0

∘: the thermal conductivity of more than 1.0 and less than 1.5, with the thermal conductivity of Comparative Example 1 regarded as 1.0

Δ: Comparative Example 1 (1.0), or the thermal conductivity equivalent to Comparative Example 1 (1.0), with the thermal conductivity of Comparative Example 1 regarded as 1.0 x: the thermal conductivity of less than 1.0, with the thermal conductivity of Comparative Example 1 regarded as 1.0

(3) 90 Degree Peeling Strength (Stripping Strength)

The obtained laminate was cut into a size of 50 mm×120 mm to obtain a test sample. The copper plate was peeled off so as to leave a copper plate of 10 mm in center width from the obtained test sample, and with respect to the copper plate of 10 mm in center width, the stripping strength of the copper plate was measured in accordance with JIS C 6481. As the peeling strength measurement device, a "Tensilon universal testing machine" manufactured by ORIENTEC CORPORATION was used. For twenty test samples, the stripping strength of the copper plate was measured to obtain twenty measurement values for the 90 degree peeling strength. The average value for the twenty measurement values for the 90 degree peeling strength was regarded as the 90 degree peeling strength. The 90 degree peeling strength was determined in accordance with the following criteria by calculating a relative value with the value of Comparative Example 1 regarded as 1.0.

[Criteria for 90 Degree Peeling Strength (Stripping Strength)]

∘∘: the 90 degree peeling strength of 1.5 or more, with the 90 degree peeling strength of Comparative Example 1 regarded as 1.0

∘: the 90 degree peeling strength of more than 1.0 and less than 1.5, with the 90 degree peeling strength of Comparative Example 1 regarded as 1.0

Δ: Comparative Example 1 (1.0), or the 90 degree peeling strength equivalent to Comparative Example 1 (1.0), with the 90 degree peeling strength of Comparative Example 1 regarded as 1.0 x: the 90 degree peeling strength of less than 1.0, with the 90 degree peeling strength of Comparative Example 1 regarded as 1.0

The details and results are shown in Tables 1 to 3 below.

TABLE 1

| | | Inorganic Filler Material | Part Number | Manufacturer | Example 1 | Example 2 | Example 3 | Example 4 | Example 5 |
|---|---|---|---|---|---|---|---|---|---|
| First Curable Material | Boron Nitride Content (% by volume) | Boron Nitride | UHP-G1H | Showa Denko K.K. | 35 | 35 | 35 | 35 | 35 |
| | Content of Inorganic Filler other than Boron Nitride (% by volume) | Aluminum Oxide | A20S | Showa Denko K.K. | 25 | 25 | 25 | 25 | 25 |
| | | | AO-502 | Admatechs Company Limited | | | | | |
| | | | BMF-B | KAWAI LIME INDUSTRY CO., LTD. | | | | | |
| | | Magnesium Oxide | RF-10C | Ube Material Industries, Ltd. | | | | | |
| | | Aluminum Nitride | ALN200SF | ThruTek | | | | | |
| Second Curable Material | Boron Nitride Content (% by volume) | Boron Nitride | UHP-G1H | Showa Denko K.K. | 65 | 65 | 65 | 62.5 | 60 |
| | Content of Inorganic Filler other than Boron Nitride (% by volume) | Aluminum Oxide | A20S | Showa Denko K.K. | | 3 | 6 | 9 | 15 |
| | | | BMF-B | KAWAI LIME INDUSTRY CO., LTD. | | | | | |
| | | Magnesium Oxide | RF-10C | Ube Material Industries, Ltd. | | | | | |
| | | Aluminum Nitride | ALN200SF | ThruTek | | | | | |
| Content of Boron Nitride in 100% by volume of Insulating Layer (% by volume) | | | | | 56.4 | 56.4 | 56.4 | 54.6 | 52.9 |
| Content of Inorganic Filler other than Boron Nitride in 100% by volume of Insulating Layer (% by volume) | | | | | 7.5 | 9.6 | 11.7 | 13.8 | 18.0 |
| Insulation Layer Thickness in Laminate (μm) | | | | | 245 | 245 | 253 | 261 | 270 |
| Evaluation | Content of Inorganic Filler other than Boron Nitride (% by volume) | | First Content | | 25 | 25 | 25 | 25 | 25 |
| | | | Second Content | | 0 | 3 | 6 | 9 | 15 |
| | | | Thermal Conductivity | | ∘ | ∘ | ∘ | ∘ | ∘ |
| | | | 90 degree Peeling Strength (Stripping Strength) | | Δ | Δ | ∘ | ∘∘ | ∘∘ |

TABLE 2

| | | Inorganic Filler Material | Part Number | Manufacturer | Example 6 | Example 7 | Example 8 | Example 9 | Example 10 |
|---|---|---|---|---|---|---|---|---|---|
| First Curable Material | Boron Nitride Content (% by volume) | Boron Nitride | UHP-G1H | Showa Denko K.K. | 35 | 35 | | 35 | 60 |
| | Content of Inorganic Filler other than Boron Nitride (% by volume) | Aluminum Oxide | A20S | Showa Denko K.K. | | | | | 15 |
| | | | AO-502 | Admatechs Company Limited | | | | 10 | |
| | | | BMF-B | KAWAI LIME INDUSTRY CO., LTD. | | | | 15 | |
| | | Magnesium Oxide | RF-10C | Ube Material Industries, Ltd. | 25 | | | | |
| | | Aluminum Nitride | ALN200SF | ThruTek | | 25 | 65 | | |
| Second Curable Material | Boron Nitride Content (% by volume) | Boron Nitride | UHP-G1H | Showa Denko K.K. | 60 | 60 | 60 | 62.5 | 35 |
| | Content of Inorganic Filler other than Boron Nitride (% by volume) | Aluminum Oxide | A20S | Showa Denko K.K. | | | 15 | | 25 |
| | | | BMF-B | KAWAI LIME INDUSTRY CO., LTD. | | | | 6 | |
| | | Magnesium Oxide | RF-10C | Ube Material Industries, Ltd. | 15 | | | | |
| | | Aluminum Nitride | ALN200SF | ThruTek | | 15 | | | |

TABLE 2-continued

| | Inorganic Filler Material | Part Number | Manufacturer | Example 6 | Example 7 | Example 8 | Example 9 | Example 10 |
|---|---|---|---|---|---|---|---|---|
| | Content of Boron Nitride in 100% by volume of Insulating Layer (% by volume) | | | 52.9 | 52.9 | 42.9 | 54.6 | 42.1 |
| | Content of Inorganic Filler other than Boron Nitride in 100% by volume of Insulating Layer (% by volume) | | | 18.0 | 18.0 | 33.0 | 8.7 | 22.0 |
| | Insulation Layer Thickness in Laminate (μm) | | | 270 | 270 | 275 | 280 | 270 |
| Evaluation | Content of Inorganic Filler other than Boron Nitride (% by volume) | First Content | | 25 | 25 | 75 | 15 | 15 |
| | | Second Content | | 15 | 15 | 15 | 6 | 25 |
| | Thermal Conductivity | | | ○ | ○○ | ○ | ○ | ○ |
| | 90 degree Peeling Strength (Stripping Strength) | | | ○○ | ○○ | ○○ | Δ | Δ |

TABLE 3

| | | Inorganic Filler Material | Part Number | Manufacturer | Example 11 | Comparative Example 1 | Comparative Example 2 | Comparative Example 3 |
|---|---|---|---|---|---|---|---|---|
| First Curable Material | Boron Nitride Content (% by volume) | Boron Nitride | UHP-G1H | Showa Denko K.K. | 35 | 60 | 50 | 65 |
| | Content of Inorganic Filler other than Boron Nitride (% by volume) | Aluminum Oxide | A20S | Showa Denko K.K. | 25 | | | |
| | | | AO-502 | Admatechs Company Limited | | | | |
| | | | BMF-B | KAWAI LIME INDUSTRY CO., LTD. | | | | |
| | | Magnesium Oxide | RF-10C | Ube Material Industries, Ltd. | | | | |
| | | Aluminum Nitride | ALN200SF | ThruTek | | | | |
| Second Curable Material | Boron Nitride Content (% by volume) | Boron Nitride | UHP-G1H | Showa Denko K.K. | 35 | 60 | 67.5 | 60 |
| | Content of Inorganic Filler other than Boron Nitride (% by volume) | Aluminum Oxide | A20S | Showa Denko K.K. | 25 | | | |
| | | | BMF-B | KAWAI LIME INDUSTRY CO., LTD. | | | | |
| | | Magnesium Oxide | RF-10C | Ube Material Industries, Ltd. | | | | |
| | | Aluminum Nitride | ALN200SF | ThruTek | | | | |
| | Content of Boron Nitride in 100% by volume of Insulating Layer (% by volume) | | | | 35.0 | 60.0 | 62.5 | 61.4 |
| | Content of Inorganic Filler other than Boron Nitride in 100% by volume of Insulating Layer (% by volume) | | | | 25.0 | 0.0 | 0.0 | 0.0 |
| | Insulation Layer Thickness in Laminate (μm) | | | | 270 | 210 | 230 | 220 |
| Evaluation | Content of Inorganic Filler other than Boron Nitride (% by volume) | First Content | | | 25 | 0 | 0 | 0 |
| | | Second Content | | | 25 | 0 | 0 | 0 |
| | Thermal Conductivity | | | | Δ | Δ | ○ | Δ |
| | 90 degree Peeling Strength (Stripping Strength) | | | | ○○ | Δ | x | x |

EXPLANATION OF SYMBOLS

1: Laminate
2: Insulating layer
2a: One surface (first surface)
2b: The other surface (second surface)
3: Metal layer
3a: One surface (first surface)
3b: The other surface (second surface)
4: Metal substrate
4a: One surface (first surface)
4b: The other surface (second surface)
5: Connecting conductive part
5a: One surface (first surface)
5b: The other surface (second surface)
6: Semiconductor chip
6a: One surface (first surface)
6b: The other surface (second surface)
7: Lead
8: Wire (metal wiring)
9: Sealing resin
11: Cured product part (part with thermosetting compound cured)
12: Boron Nitride
13: Inorganic filler other than boron nitride
21: Electronic device
31: First insulating layer material
32: Second insulating layer material
33: Release film
34: First Curable Material
35: Second Curable Material

The invention claimed is:

1. A laminate comprising:
a metal substrate;
an insulating layer laminated on one surface of the metal substrate; and
a patterned metal layer laminated on a surface of the insulating layer on a side opposite to a metal substrate side,
the patterned metal layer laminated on a surface of the insulating layer on a side opposite to a metal substrate side being 300 μm or more in thickness,
the insulating layer comprising a thermosetting compound, a thermosetting agent or a curing catalyst, boron nitride, and an inorganic filler other than boron nitride,
the thermosetting compound comprising an epoxy compound, an oxetane compound, an episulfide compound, or a silicone compound, and a content of the inorganic filler other than the boron nitride on a patterned metal layer side of the insulating layer being higher than a content of the inorganic filler other than the boron nitride on the metal substrate side of the insulating layer.

2. The laminate according to claim 1, wherein
the boron nitride has an average aspect ratio of 2 or more, and
the inorganic filler other than the boron nitride has an average aspect ratio of less than 2.

3. The laminate according to claim 1, wherein a material for the inorganic filler other than the boron nitride is an aluminum oxide, an aluminum nitride, a magnesium oxide, or a silicon carbide.

4. The laminate according to claim 1, wherein the insulating layer comprises the boron nitride as boron nitride aggregated particles.

5. The laminate according to claim 1, wherein the laminate is used with a semiconductor chip disposed on a surface of the patterned metal layer on a side opposite to an insulating layer side.

6. An electronic device comprising:
the laminate according to claim 1; and
a semiconductor chip disposed on a surface of the patterned metal layer on a side opposite to an insulating layer side in the laminate.

7. The laminate according to claim 1, wherein a content of the inorganic filler other than boron nitride in 100% by volume of a region corresponding to 30% of the thickness from the surface of the insulating layer on the patterned metal layer side toward the surface of the insulating layer on the metal substrate side is higher than a content of the inorganic filler other than boron nitride in 100% by volume of a region corresponding to 70% of the thickness from the surface of the insulating layer on the metal substrate side toward the surface of the insulating layer on the patterned metal layer side.

* * * * *